(12) United States Patent
Iyatani et al.

(10) Patent No.: US 8,783,794 B2
(45) Date of Patent: Jul. 22, 2014

(54) ELECTRONIC CONTROL UNIT AND VEHICLE BEHAVIOR CONTROL DEVICE

(75) Inventors: Masatoshi Iyatani, Nagano (JP); Naoki Obuse, Nagano (JP)

(73) Assignee: Nissin Kogyo Co., Ltd., Nagano (JP)

( * ) Notice: Subject to any disclaimer, the term of this patent is extended or adjusted under 35 U.S.C. 154(b) by 387 days.

(21) Appl. No.: 12/472,991

(22) Filed: May 27, 2009

(65) Prior Publication Data

US 2010/0133896 A1 Jun. 3, 2010

(30) Foreign Application Priority Data

May 27, 2008 (JP) .................................. 2008-137463
Apr. 22, 2009 (JP) .................................. 2009-103551

(51) Int. Cl.
*B60T 8/36* (2006.01)

(52) U.S. Cl.
USPC ................................. 303/119.3; 303/DIG. 10

(58) Field of Classification Search
CPC ............ H02K 11/0073; B60R 16/0239; B60T 8/3675; B60T 8/368; B60T 8/363; B60T 8/365; B60T 15/028; G06F 1/203
USPC ......... 303/116.4, 119.2, 119.3, 199, DIG. 10; 73/493, 495, 504.03; 361/752, 807, 361/810, 679.46–679.54; 439/55–85; 174/50, 50.52, 520, 521, 524, 526, 174/530, 535, 537, 539, 547, 556, 559, 174/563; 29/852; 340/426.32; 250/211, 239
See application file for complete search history.

(56) References Cited

U.S. PATENT DOCUMENTS

| 5,022,717 | A | | 6/1991 | Heibel et al. |
|---|---|---|---|---|
| 5,130,543 | A | * | 7/1992 | Bradbeer ...................... 250/342 |
| 5,438,479 | A | * | 8/1995 | Heilbronner .................. 361/707 |
| 5,532,533 | A | * | 7/1996 | Mizutani ..................... 310/68 B |
| 5,693,943 | A | * | 12/1997 | Tchernihovski et al. ...... 250/342 |
| 7,021,418 | B2 | * | 4/2006 | Tominaga et al. ............. 180/444 |
| 7,042,188 | B2 | * | 5/2006 | Miura et al. ............. 318/400.09 |
| 7,166,981 | B2 | * | 1/2007 | Kakutani et al. .............. 318/567 |
| 7,375,313 | B2 | * | 5/2008 | Lee et al. ....................... 250/221 |
| 2002/0112765 | A1 | | 8/2002 | Frank et al. |
| 2004/0102888 | A1 | | 5/2004 | Burgdorf et al. |
| 2004/0163470 | A1 | * | 8/2004 | Babala et al. ............... 73/514.01 |
| 2006/0125314 | A1 | | 6/2006 | Hashiba |
| 2006/0225946 | A1 | * | 10/2006 | Yamazaki et al. ............ 180/446 |

FOREIGN PATENT DOCUMENTS

| CN | 1756015 A | 4/2006 |
|---|---|---|
| DE | 199 29 209 A1 | 1/2001 |
| DE | 100 44 266 A1 | 4/2002 |
| EP | 0 373 551 A2 | 6/1990 |

(Continued)

*Primary Examiner* — Bradley King
*Assistant Examiner* — Stephen Bowes
(74) *Attorney, Agent, or Firm* — Arent Fox LLP

(57) ABSTRACT

An electronic control unit which includes: a sensor board to which a sensor for detecting a predetermined physical quantity is attached; a control board which controls an operation of an electric part based on the physical quantity detected by the sensor; and a housing which accommodates the sensor board and the control board, wherein the housing has a first room for accommodating the electric part, a second room for accommodating the sensor board and the control board in a stacked condition, and a partition portion for separating the first room and the second room from each other, wherein a recess which is opened to the second room is formed in the partition portion, and a sensor accommodating portion for accommodating the sensor is formed using the recess.

3 Claims, 8 Drawing Sheets

(56) References Cited

FOREIGN PATENT DOCUMENTS

| EP | 0 705 747 A1 | 4/1996 |
|---|---|---|
| JP | 2000 159083 A | 6/2000 |
| JP | 2005-200013 A | 7/2005 |
| JP | 2005 329894 A | 12/2005 |
| WO | WO-2004/069623 A1 | 8/2004 |

* cited by examiner

ELECTRONIC CONTROL UNIT AND VEHICLE BEHAVIOR CONTROL DEVICE

BACKGROUND OF THE INVENTION

1. Field of the Invention

The present invention relates to an electronic control unit and a vehicle behavior control device using the electronic control unit.

2. Description of the Related Art

A vehicle behavior control device for stabilizing the behavior of a vehicle like a car includes electric parts, such as an electromagnetic valve and a pressure sensor, a motorized part like a motor, a reciprocating pump driven by the motor, a reservoir-configuring part functioning as a reservoir, a control board for controlling operations of the electromagnetic valve and the motor, and a base body which has brake fluid paths formed therein and is assembled with the foregoing various parts.

In the foregoing vehicle behavior control device, a sensor which detects the behavior of a vehicle body is incorporated in the control board. The control board controls the operations of the electromagnetic valve and the motor based on the behavior of the vehicle body detected by the sensor to change the brake fluid pressure in the brake fluid paths, thereby controlling the braking force of a brake. Accordingly, the behavior of the vehicle is then stabilized.

As an example, an electronic control unit for the foregoing vehicle behavior control device has a sensor board equipped with a sensor, a control board which controls the operations of an electromagnetic valve and a motor based on the behavior of a vehicle body detected by the sensor, and a housing which accommodates the sensor board and the control board in a stacked condition. According to the conventional electronic control unit, the housing has a recess protruding toward the exterior formed at the internal face of the housing, and the sensor and the sensor board are accommodated in the recess (see, for example, JP2005-200013A, paragraph 0015, FIGS. 2 and 3).

According to such an electronic control unit, since it is unnecessary to connect the sensor with the control board using a part like a harness, the number of parts can be reduced. Moreover, since it is unnecessary to accommodate the sensor and the electronic control unit separately inside the vehicle, the size and weight of the vehicle can be reduced.

Furthermore, since it is unnecessary to attach the sensor to the control board, it is unnecessary to use a large area for the control board.

Still further, since a target when the sensor is inspected and adjusted is merely the sensor board, efficiency in the sensor inspection/adjustment procedure can be improved.

Yet further, when the specification of the sensor is changed, it is necessary to change parts of the sensor board only, and it is unnecessary to change parts of the control board, so that it is possible to reduce the cost and the work hour inherent to the change of the specification of the sensor.

According to the foregoing conventional electronic control unit, however, since a portion where the sensor is accommodated protrudes from the external face of the housing, there is a problem that the size of the housing becomes large.

It is, therefore, an object of the present invention to provide an electronic control unit and a vehicle behavior control device using the electronic control unit, which can miniaturize a housing in which a sensor board and a control board are accommodated, thereby making the whole electronic control unit compact.

SUMMARY OF THE INVENTION

To achieve the object, an electronic control unit according to one aspect of the present invention includes: a sensor board to which a sensor for detecting a predetermined physical quantity is attached; a control board which controls an operation of an electric part based on the physical quantity detected by the sensor; and a housing which accommodates the sensor board and the control board, wherein the housing has a first room for accommodating the electric part, a second room for accommodating the sensor board and the control board in a stacked condition, and a partition portion for separating the first room and the second room from each other, wherein a recess which is opened to the second room is formed in the partition portion, and a sensor accommodating portion for accommodating the sensor is formed using the recess.

According to this structure, the sensor accommodating portion for accommodating the sensor is so formed as to protrude into the first room using the recess provided at the partition portion. That is, according to this structure, by efficiently using an internal space of the first room, it becomes unnecessary to cause a portion for accommodating the sensor to protrude from an external face of the housing. Hence, according to this structure, the housing can be miniaturized, thereby making the whole electronic control unit compact.

Moreover, as a portion for separating the first room and the sensor accommodating portion from each other is integrally formed with the partition portion, it is unnecessary to provide a separate part for forming the sensor accommodating portion at the partition portion. Therefore, according to the foregoing structure, it is possible to reduce the number of parts of the electronic control unit.

To achieve the object, an electronic control unit according to another aspect of the present invention includes: a sensor board to which a sensor for detecting a predetermined physical quantity is attached; a control board which controls an operation of an electric part based on the physical quantity detected by the sensor; and a housing which accommodates the sensor board and the control board, wherein the housing has a first room for accommodating the electric part, a second room for accommodating the sensor board and the control board in a stacked condition, and a sensor accommodating portion communicating with the second room, wherein the sensor accommodating portion is formed so as to protrude into the first room using an opening formed in the partition portion for separating the first room and the second room from each other, and the sensor is accommodated in the sensor accommodating portion.

Note that the sensor accommodating portion in another aspect of the present invention is a space protruding into the first room to accommodate the sensor, and may not be partitioned by a wall.

According to this structure, the sensor accommodating portion for accommodating the sensor is so formed as to protrude into the first room using the opening formed in the partition portion. That is, in this structure, it is unnecessary to cause a portion for accommodating the sensor to protrude from an external face of the housing by efficiently using a space of the first room. Hence, according to the foregoing structure, the housing can be miniaturized, thereby making the whole electronic control unit compact.

In the foregoing electronic control unit in which the sensor accommodating portion is formed using the opening formed in the partition portion, the sensor accommodating portion and the first room may be separated from each other by a conductive shielding member; the housing may further accommodate a connection terminal therein for feeding power to a motorized part provided at an exterior of the housing; and the shielding member and the motorized part may be electrically connected together via the connection terminal.

According to this structure, even if electrical noises are generated from the electric part, such noises flow into the motorized part through the conductive shielding member and the connection terminal. That is, as the shielding member for separating the sensor accommodating portion and the first room from each other is grounded, it is possible to cut off such electric noises. Accordingly, it becomes unnecessary to attach a capacitor or the like which reduces such electric noises to the sensor board or the control board, so that the number of parts of the electronic control unit can be reduced, and the production cost thereof can be reduced.

Moreover, as heats generated from the electric part is blocked by the shielding member, it is possible to prevent such heats from affecting the sensor, thereby improving the detection accuracy of the sensor.

In the foregoing electronic control unit, the sensor board may be mounted on a face of the partition portion at the second room side.

According to this structure, as the sensor board attached to the partition portion is stabilized, it is possible to suppress any deflection of the sensor board, and to improve the detection accuracy of the sensor.

In the foregoing electronic control unit, an angular velocity sensor and an acceleration sensor may be used for the sensor.

According to this structure, the electronic control unit, in which the angular velocity sensor and the acceleration sensor used for detecting a behavior of a vehicle body is built, can be made compact.

To achieve the object, a vehicle behavior control device according to the other aspect of the present invention includes a base body having a brake fluid path formed therein, and the electronic control unit, wherein the control board controls a brake fluid pressure in the brake fluid path by controlling an operation of the electric part based on a behavior of a vehicle body detected by the sensor.

According to this structure, the housing can be miniaturized, and the whole electronic control unit can be made compact, thereby reducing the size of the vehicle behavior control device.

According to the electronic control unit of the present invention, it is possible to miniaturize the housing, thereby making the whole electronic control unit compact.

Moreover, according to the vehicle behavior control device using the foregoing electronic control unit, the housing can be miniaturized and the whole electronic control unit can be made compact, thereby reducing the size of the vehicle behavior control device.

BRIEF DESCRIPTION OF THE DRAWINGS

FIG. 5A is a perspective view showing the shielding member and FIG. 5B is a perspective view showing the sensor board;

DETAILED DESCRIPTION OF THE PREFERRED EMBODIMENTS

Figure 1:
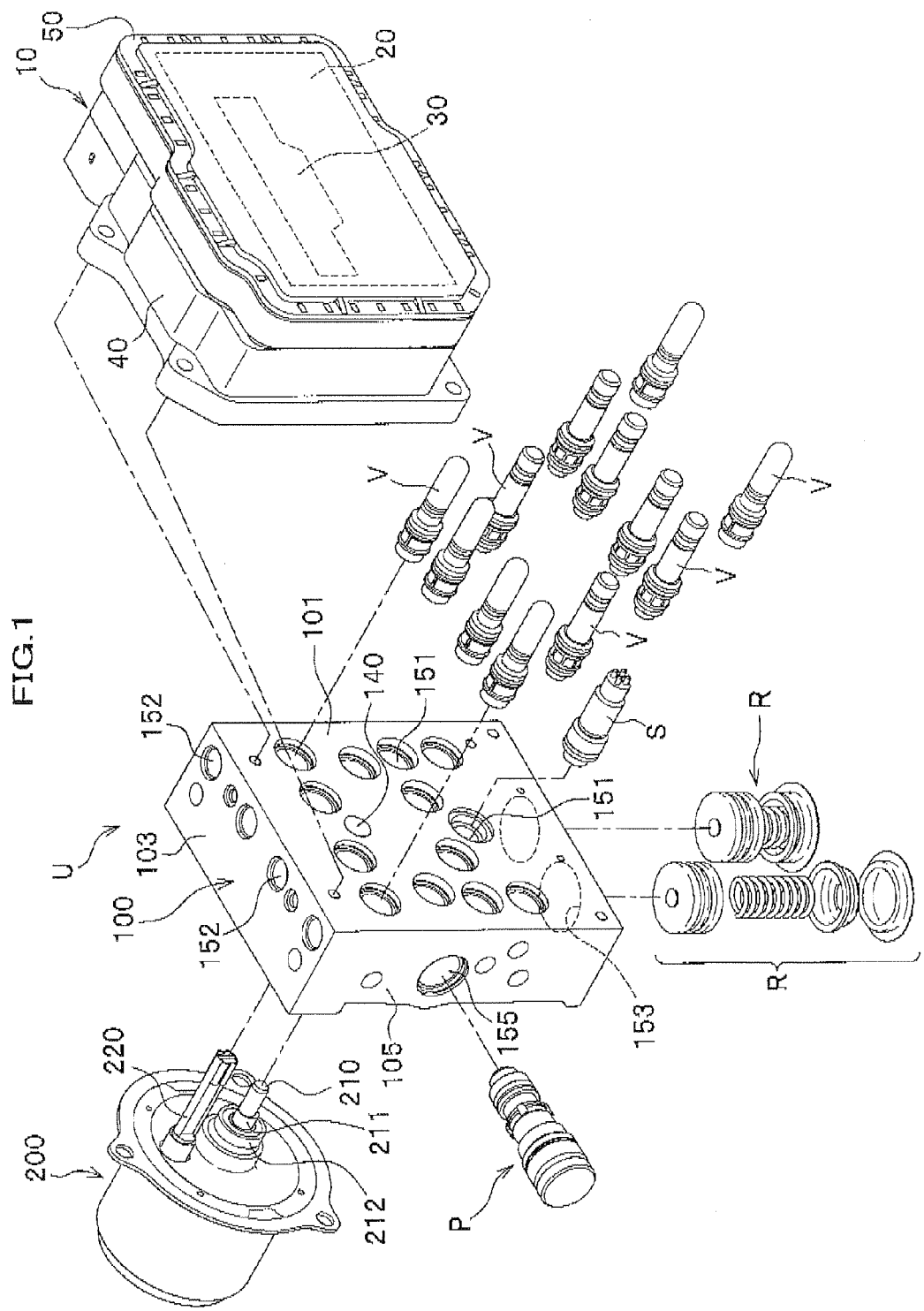
FIG. 1 is an exploded perspective view showing a vehicle behavior control device having an electronic control unit according to a first embodiment of the present invention.

Embodiments of the present invention will be explained with reference to the accompanying drawings.

Note that in the respective embodiments, the same part will be denoted by the same reference numeral, and a duplicated explanation will be omitted.

In the embodiments, an explanation will be given of, as an example, an electronic control unit which is applied to a vehicle behavior control device that controls the braking force of a brake to stabilize the behavior of a car.

<First Embodiment>
[Structure of Vehicle Behavior Control Device]

First, an explanation will be given of a structure of a vehicle behavior control device U according to the first embodiment of the present invention with reference to FIG. 1.

The vehicle behavior control device U mainly includes a base body 100 with which electric parts such as an electromagnetic valve V and a pressure sensor S, a motorized part like a motor 200, and a reciprocating pump P are assembled, and an electronic control unit 10 that detects behavior of a vehicle body and controls opening/closing of the electromagnetic valve V and operation of the motor 200. Brake fluid paths are formed inside the base body 100, and as the electronic control unit 10 activates the electromagnetic valve V and the motor 200 based on the behavior of the vehicle body, the brake fluid pressure in the brake fluid paths are changed.

(Structure of Base Body)

As shown in FIG. 1, the base body 100 is a metal part formed in substantially a square shape, and the brake fluid paths (oil paths) are formed therein.

In the respective faces of the base body 100, a front face 101 is provided with, for example, plural attachment holes 151 each having a bottom. The electromagnetic valve V and the pressure sensor S are fitted into the respective attachment holes 151.

A top face 103 of the base body 100 is provided with, for example, four outlet ports 152, each connected with a pipe communicated with a brake for a wheel (not shown).

A bottom face of the base body 100 is provided with, for example, two reservoir holes 153. Reservoir parts R each configuring a reservoir are attached to the respective reservoir holes 153.

A side face 105 of the base body 100 is provided with, for example, a pump hole 155 into which the reciprocating pump P is fitted.

Note that the holes of the base body 100 are communicated with each other directly or via the non-illustrated brake fluid paths formed inside the base body 100.

(Structure of Motor)

Figure 2:
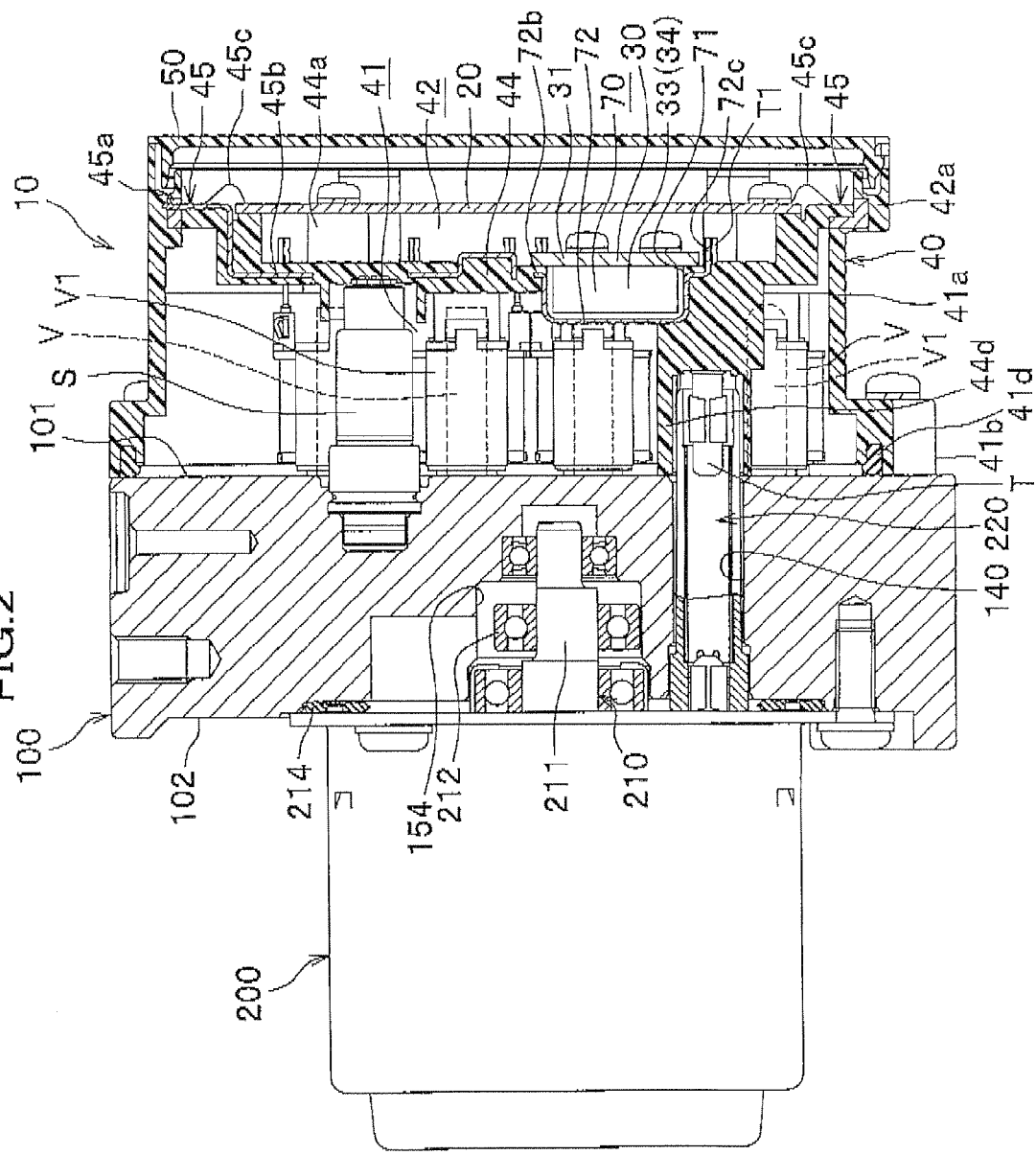
FIG. 2 is a side cross-sectional view showing a vehicle behavior control device having an electronic control unit according to the first embodiment.

The motor 200 is a part that functions as a power source for the reciprocating pump P, and as shown in FIG. 2, is integrally fixed to a back face 102 of the base body 100. A ring sealing member 214 which liquid-tightly seals a space between the back face 102 of the base body 100 and the motor 200 is provided between the motor 200 and the back face 102 of the base body 100.

A power output shaft 210 of the motor 200 is provided with an eccentric shaft portion 211, and a ball bearing 212 is fitted in the eccentric shaft portion 211. The eccentric shaft portion 211 and the ball bearing 212 are fitted into a motor attachment hole 154. A motor bus bar 220 for supplying power to a non-illustrated rotor is provided above the power output shaft 210. The motor bus bar 220 is inserted into a terminal hole 140, and is connected to a control board 20 through a terminal T provided inside a housing 40.

[Structure of Electronic Control Unit]

As shown in FIG. 1, the electronic control unit 10 has a housing for accommodating the electrical parts protruding from the base body 100, a sensor board 30, and the control board 20, and a cover 50 that blocks off an opening portion of the housing 40.

(Structure of Housing)

As shown in FIG. 2, the housing 40 is a box formed of a synthesis resin and integrally fixed to the front face 101 of the base body 100 while covering the electric parts such as the electromagnetic valve V and the pressure sensor S, all protruding from the front face 101 of the base body 100.

The housing 40 has a face (right side face in FIG. 2) opposite to the base body 100 and a face (left side face in FIG. 2) toward the base body 100, and both faces are opened. A first room 41 for accommodating the electric parts, such as the electromagnetic valve V, an electromagnetic coil V1, and the pressure sensor S, is formed at the rear of the internal space of the housing 40. A second room 42 for accommodating the sensor board 30 and the control board 20 is formed at the front of the internal space of the housing 40.

The housing 40 has a first peripheral wall 41a forming the first room 41, a connector connection portion 43 (see FIG. 3) disposed at a side of the first peripheral wall 41a, a second peripheral wall 42a forming the second room 42, and a partition portion 44 (see FIG. 3) for separating the first room 41 and the second room 42 from each other.

Figure 4:
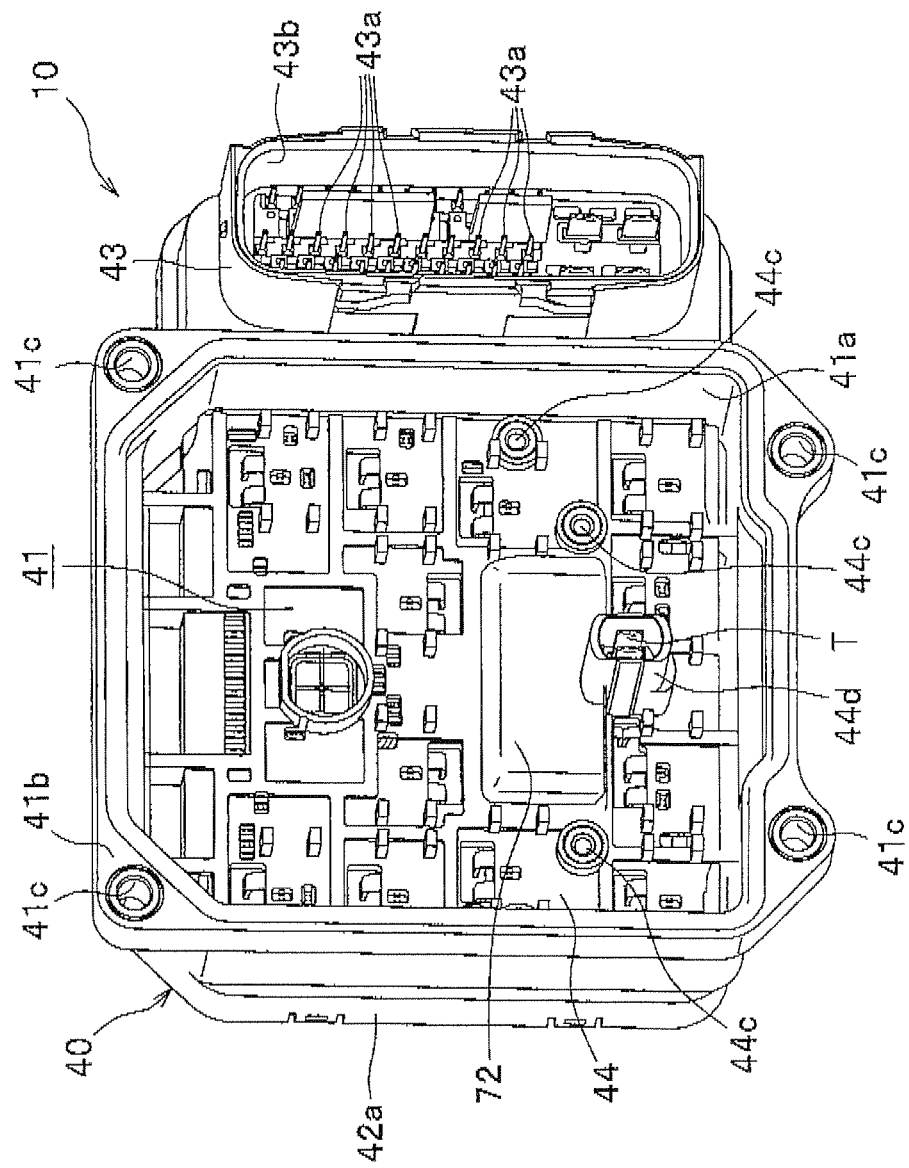
FIG. 4 is a perspective view showing the electronic control unit of the first embodiment as viewed from the back of a housing.

The first peripheral wall 41a surrounds the electric parts, and has a flange 41b which abuts the outer peripheral edge of the front face 101 of the base body 100. The flange 41b has attachment holes 41c (see FIG. 4) formed at appropriate positions.

A ring sealing member 41d is attached to an end face of the flange 41b toward the base body 100 along the inner periphery of the flange 41b. The sealing member 41d adheres to the front face 101 of the base body 100, thereby sealing a space between the base body 100 and the housing 40.

Figure 3:
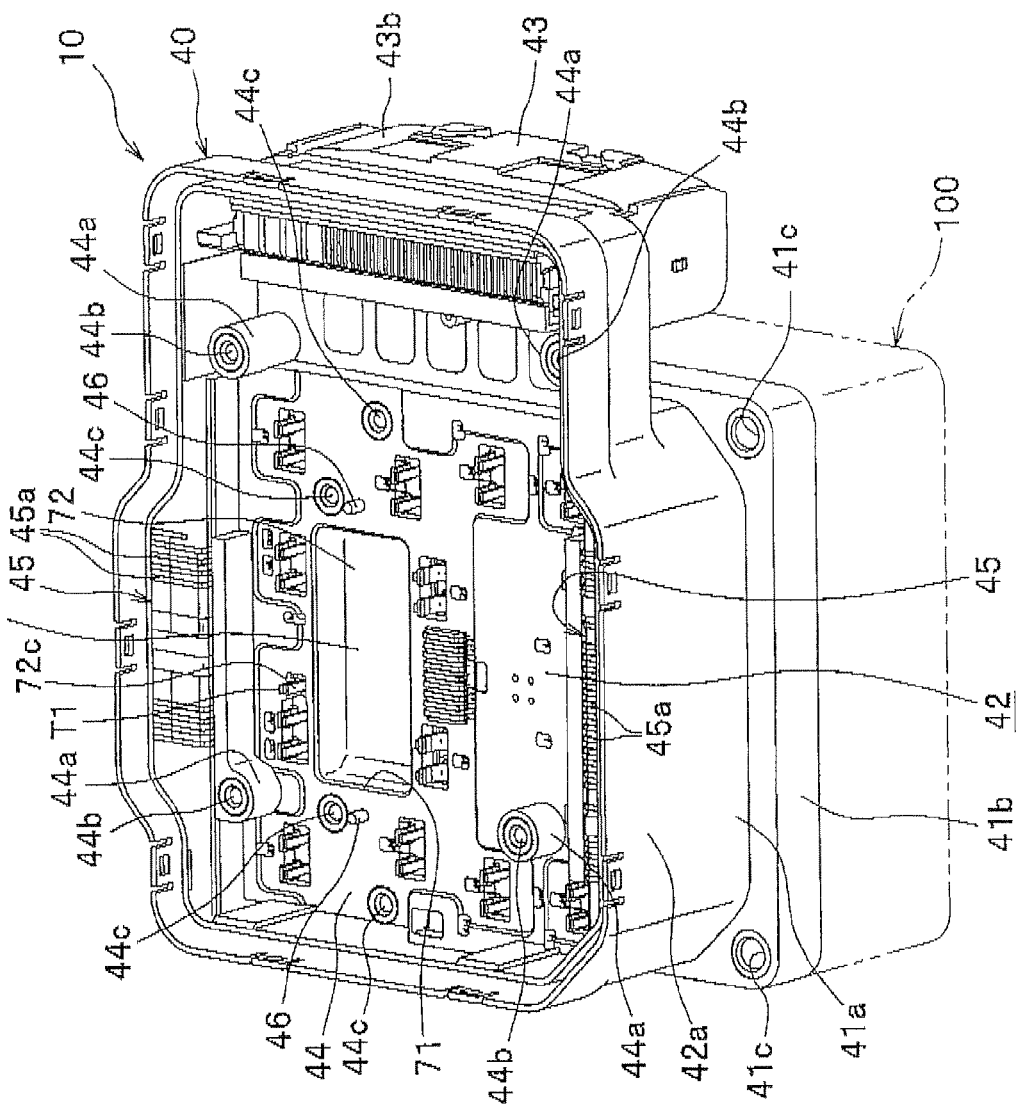
FIG. 3 is a perspective view showing an electronic control unit of the first embodiment as viewed from the front of a housing in a condition before a sensor board and a control board are attached to the housing.

The second peripheral wall 42a surrounds the sensor board 30 and the control board 20, and is disposed at the front of the first peripheral wall 41a and the connector connection portion 43 (see FIG. 3).

As shown in FIG. 3, the second peripheral wall 42a has a substantially rectangular external contour, and has outwardly expanding portions at two sides in the lengthwise direction (top and bottom two sides in FIG. 3): A terminal gathering portion 45 is formed inwardly of the expanding portions of the second peripheral wall 42a.

At the terminal gathering portion 45, front faces (faces at the side of the second room 42) of a plurality of terminals 45a which are metal parts are exposed at the outer periphery of the control board 20. As shown in FIG. 2, conductive members 45b extending from the terminals 45a are laid in the partition portion 44, and are electrically connected to a terminal of the electromagnetic coil V1, a terminal of the pressure sensor S, and the motor bus bar 220 of the motor 200, respectively, at the rear (a side toward the first room 41) of the partition portion 44.

The connector connection portion 43 shown in FIG. 3 is a portion where a connector provided at an end of a non-illustrated external wiring cable is connected. The connector connection portion 43 has plural connection terminals 43a (see FIG. 4) running through a bottom wall of the connector connection portion 43 from the second room 42 and derived to an external face (a surface externally exposed), and a side wall 43b surrounding the connection terminals 43a.

As shown in FIG. 2, the partition portion 44 is a tabular portion facing the front face 101 of the base body 100 with a space. As shown in FIG. 3, the partition portion 44 of the first embodiment is formed in a substantially rectangular shape, and has board holding members 44a protrudingly provided at the respective four corners at the second room 42 side.

The board holding member 44a supports the control board 20 (see FIG. 7), and an end face of each board holding member 44a abuts the rear face of the control board 20. Moreover, the board holding member 44a has an attachment hole 44b formed at the end face, and the attachment hole 44b has a threaded inner peripheral surface.

As shown in FIG. 2, the partition portion 44 is provided with a terminal attachment portion 44d where a terminal T passes all the way through. One end of the terminal T protrudes into the first room 41, while the other end protrudes into the second room 42.

An opening 71 is formed at a portion adjacent to the terminal attachment portion 44d around the center of a face of the partition portion 44 at the second room 42 side. A boxy shielding member 72 is attached to the opening 71 in such a manner as to protrude to the first room 41. An internal space of the shielding member 72 functions as a sensor accommodating portion 70 communicating with the second room 42. That is, using the opening 71 formed in the partition portion 44 separating the first room 41 and the second room 42 from each other, the sensor accommodating portion 70 is formed.

Figure 5A:
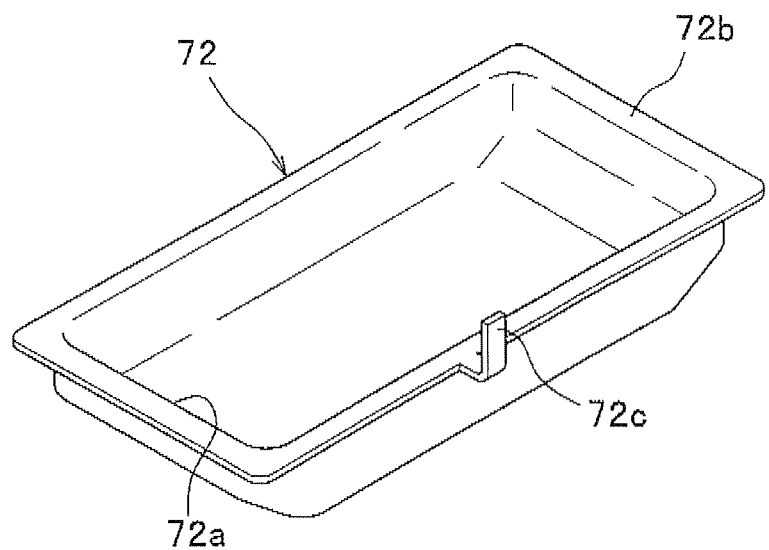
FIGS. 5A and 5B show a shielding member and a sensor board both used for an electronic control unit of the first embodiment, where

The shielding member 72 is a casing formed of a conductive metal, and is a square box as shown in FIG. 5A which is provided with an opening 72a formed in the top face. A flange 72b which protrudes in a lateral direction is formed around the entire edge of the opening 72a of the shielding member 72. A grounding terminal 72c raised vertically is formed at the central portion of the flange 72b formed at one side (right side in FIG. 2) of the shielding member 72 in the lengthwise direction.

As shown in FIG. 2, the shielding member 72 is attached in the opening 71 in such a way that the bottom portion of the shielding member 72 protrudes to the first room 41 with the flange 72b being laid under the inner peripheral surface of the opening 71 formed in the partition portion 41. In the first embodiment, when the housing 40 is formed, the shielding member 72 is attached to the partition portion 44 by molding.

A leading end of the grounding terminal 72c of the shielding member 72 protrudes from a surface of the partition portion 44 at the second room 42 side, and as the grounding terminal 72c is welded to the other end T1 of the terminal T, the shielding member 72 is electrically connected to the terminal T. Since the terminal T is connected to the motor bus bar 220, the shielding member 72 and the motor 200 are electrically connected together via the terminal T and the motor bus bar 220.

As shown in FIG. 3, two reference pins 46, 46 are protrudingly provided on the face of the partition portion 44 at the second room 42 side in such a manner as to sandwich the opening 71 in the lengthwise direction (i.e., spaced apart with a predetermined distance in the horizontal direction in FIG. 3). Moreover, attachment holes 44c are formed in the face of the partition portion 44 at the second room 42 side two by two in such a way that a pair of attachment holes 44c sandwich the opening 71 in the lengthwise direction (i.e., spaced apart with a predetermined distance in the horizontal direction in FIG. 3). The attachment holes 44c each has a threaded inner peripheral surface.

(Structure of Cover)

As shown in FIG. 1, the cover 50 is formed of a synthesis resin, tightly covers an opening of the housing 40 at the opposite side to the base body 100, and is fixed to the front end face of the housing 40 by means of, for example, welding or bonding.

(Structure of Sensor Board)

Figure 5B:
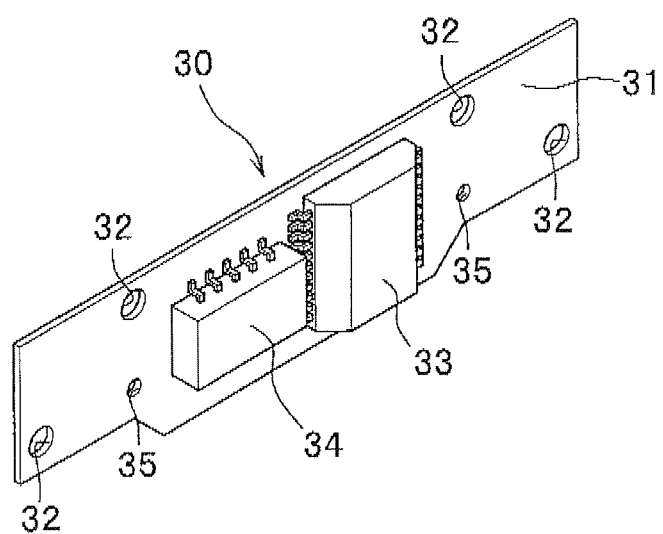

As shown in FIG. 5B, the sensor board 30 is a rectangular substrate 31 on which electric circuits (conductive members), to which electric parts such as an angular velocity sensor 33 and an acceleration sensor 34 are attached, are printed. As the substrate 31 is attached to the surface of the housing 40 at the second room 42 side, the sensor board 30 is fixed inside the second room 42 at the partition portion 44 side under the control board 20 (see FIG. 6).

The sensor board 30 is configured to be able to detect the behavior of the vehicle body (predetermined physical quantity) through the angular velocity sensor 33 and the acceleration sensor 34.

Figure 6:
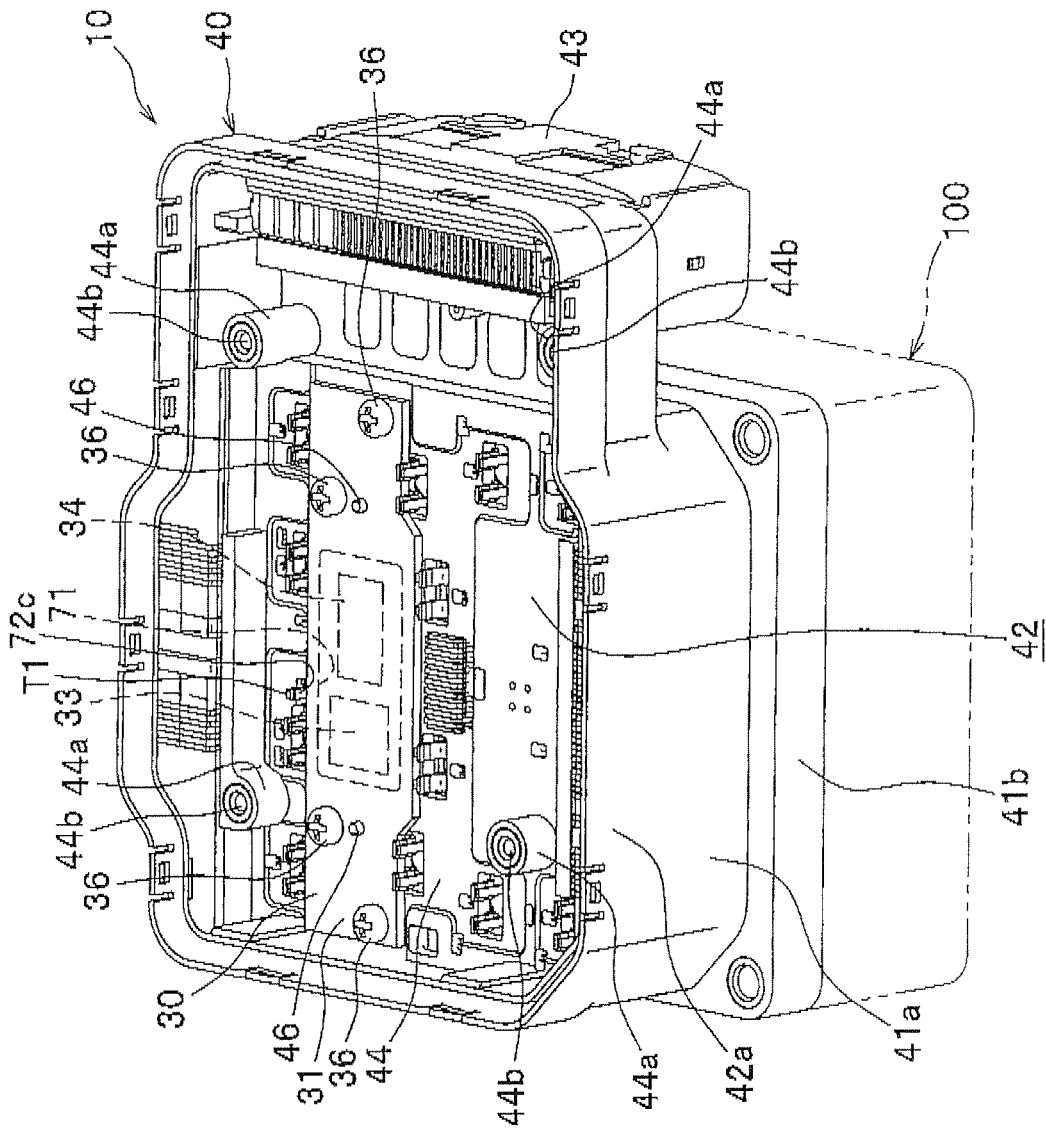
FIG. 6 is a perspective view showing an electronic control unit of the first embodiment as viewed from the front of a housing in a condition where a sensor board are attached to the housing.

As shown in FIG. 6, the sensor board 30 is mounted on the surface of the partition portion 44 at the second room 42 side with a surface, to which the angular velocity sensor 33 and the acceleration sensor 34 are attached, facing down toward the partition portion 44. When the sensor board 30 is attached to the partition portion 44, as shown in FIG. 2, the angular velocity sensor 33 and the acceleration sensor 34 are accommodated in the shielding member 72 of the sensor accommodating portion 70 formed in the partition portion 44 from the side of the second room 42.

As shown in FIG. 5B, insertion holes 32 to be communicated with the respective attachment holes 44c (see FIG. 3) of the partition portion 44 are formed two by two at both ends of the sensor board 30 in the lengthwise direction. As shown in FIG. 6, as the leading end of a fixing bolt 36 inserted into the insertion hole 32 from the front face of the sensor board 30 is screwed in the attachment hole 44c (see FIG. 3) of the partition portion 44, the sensor board 30 is attached to the face of the partition portion 44 at the second room 42 side.

Note that as shown in FIG. 6, it is desirable that the sensor board 30 should have the substrate 31 mounted on across the entire edge of the opening 71 of the partition portion 44 to be highly stabilized.

Furthermore, positioning holes 35, 35 (see FIG. 5B) in which respective reference pins 46, 46 (see FIG. 3) protrudingly provided on the partition portion 44 are inserted are formed in the sensor board 30. Accordingly, when the sensor board 30 is attached to the partition portion 44, as the reference pins 46, 46 are inserted into the respective positioning holes 35, 35, the sensor board 30 can be positioned on the face of the partition portion 44 at the second room 42 side. When the sensor board 30 is positioned on the face of the partition portion 44 at the second room 42 side, it is structured in such a way that a detection axis of the angular velocity sensor 33 attached on the sensor board 30 matches the top-bottom direction of the vehicle and a detection axis of the acceleration sensor 34 attached on the sensor board 30 matches the front-rear and right-left directions of the vehicle.

(Structure of Control Board)

Figure 7:
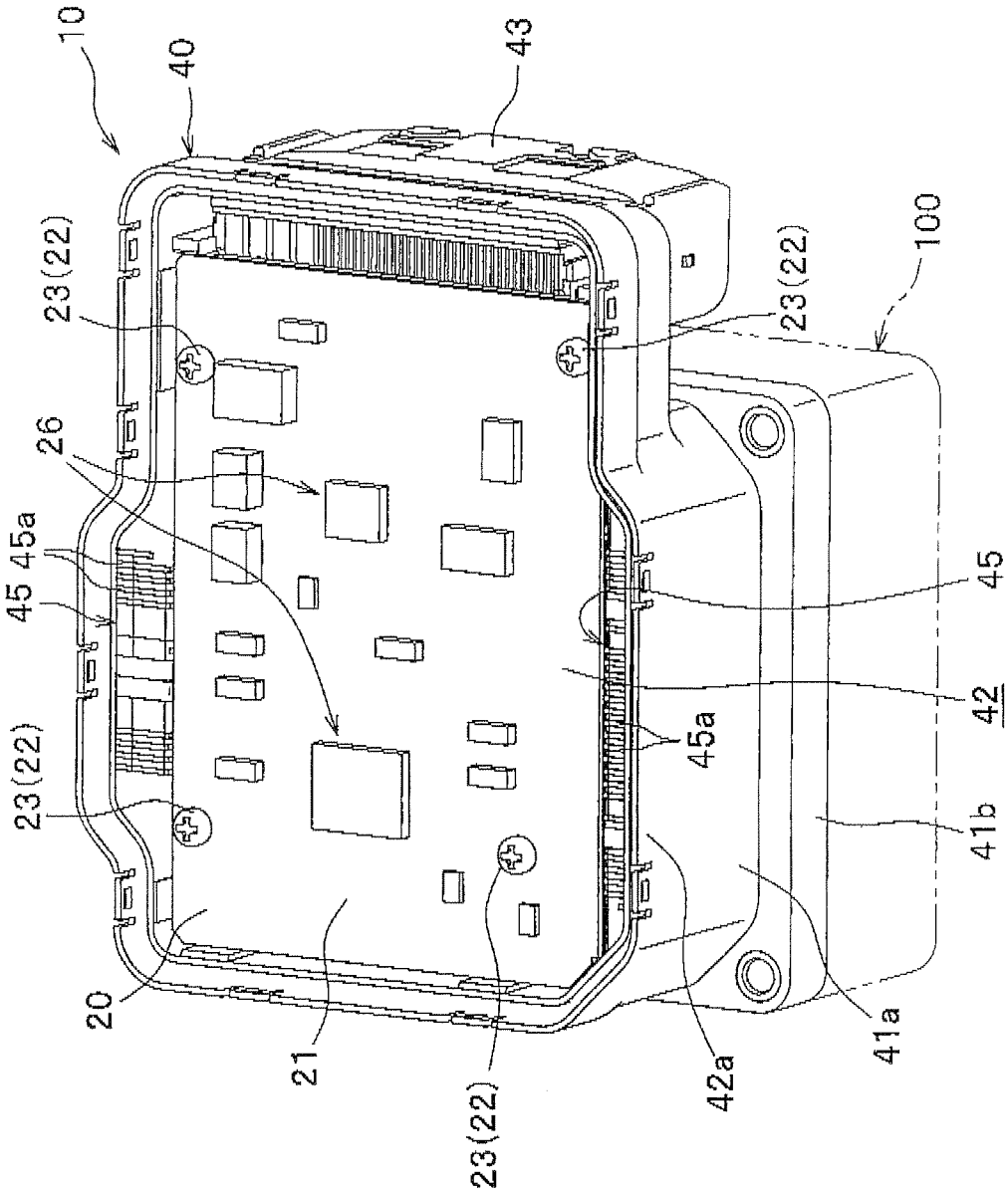
FIG. 7 is a perspective view showing an electronic control unit of the first embodiment in a condition that a sensor board and control board are attached to a housing as viewed from the front of the housing.

As shown in FIG. 7, the control board 20 is a rectangular substrate 21 on which electric circuits (conductive members), to which electric parts 26 like semiconductor chips are attached, are printed. As the substrate 21 is attached to the face of the partition portion 44 of the housing 40 at the second room 42 side with the face to which the electric parts 26 are attached being faced up, the control board 20 is fixed inside the second room 42 (see FIG. 2).

The control board 20 is structured to control the opening/closing of the electromagnetic valve V and the operation of the motor 200 based on information acquired from the sensor board 30 and various sensors like the pressure sensor S and a program stored beforehand.

As shown in FIG. 7, the control board 20 has insertion holes 22 formed in respective portions in the vicinity of the respective four corners of the substrate 21. When the control board 20 is attached to the partition portion 44 (see FIG. 3) at the second room 42 side, the insertion holes 22 are communicated with respective attachment holes 44b of the board holding members 44a (see FIG. 3). As the leading end of a fixing bolt 23 inserted into the insertion hole 22 from the front face of the control board 20 is screwed in the attachment hole 44b of the board holding member 44a (see FIG. 3), the control board 20 is attached to the partition portion 44 at the second room 42 side. Accordingly, as shown in FIG. 2, the rear face of the control board 20 and the face of the partition portion 44 at the second room 42 side are arranged in parallel with each other with a predetermined clearance, and the sensor board 30 attached to the face of the partition portion 44 at the second room 42 side and the control board 20 are accommodated in the second room 42 in a stacked condition.

In the control board 20 attached to the partition portion 44 (see FIG. 3) at the second room 42 side, the electric circuits of the control board 20 and the terminals 45a of the terminal gathering portion 45 are electrically connected via bonding wires 45c. Accordingly, various electric parts attached to the control board 20 and the electric parts attached to the base body 100 are electrically connected together.

Moreover, in the sensor board 30 shown in FIG. 2 and attached to the partition portion 44, conductive members (not shown) laid under the partition portion 44 are electrically connected to the sensor board 30, and as the conductive members are electrically connected to the terminals 45a of the terminal gathering portion 45, the electric circuits of the sensor board 30 and the electric circuits of the control board 20 are electrically connected together. Accordingly, it becomes possible for the angular velocity sensor 33 and the acceleration sensor 34 both attached to the sensor board 30 to output vehicular behavior information to the control board 20.

[Operations and Effects of Electronic Control Unit and Vehicle Behavior Control Device]

According to the electronic control unit 10 of the first embodiment, as shown in FIG. 2, the sensor accommodating portion 70 which accommodates the angular velocity sensor 33 and the acceleration sensor 34 is formed in such a manner as to protrude to the first room 41 using the opening 71 formed in the partition portion 44. That is, according to the electronic control unit 10, by efficiently using the space of the first room 41, it becomes unnecessary to cause a portion for accommodating the angular velocity sensor 33 and the acceleration sensor 34 to protrude from the external face of the housing 40.

Moreover, as the sensor board 30 and the control board 20 are accommodated in the housing 40 in a stacked condition, it is not necessary to attach the angular velocity sensor 33 and the acceleration sensor 34 on a face of the control board 20, so that it becomes unnecessary to secure a large area of the control board 20.

Therefore, according to the electronic control unit 10 of the first embodiment, it is possible to reduce the size of the housing 40, thereby making the whole electronic control unit 10 compact.

Note that in the first room 41, in consideration of tolerances when electric parts, such as the electromagnetic valve V and the pressure sensor S, are assembled, and in order to prevent any vibrations from transmitting to the electrical parts from the housing 40, there are many spaces between the partition portion 44 and the electric parts. According to the first embodiment, by accommodating the angular velocity sensor 33 and the acceleration sensor 34 in these spaces, it becomes unnecessary to cause a portion for accommodating the angular velocity sensor 33 and the acceleration sensor 34 to protrude from the external face of the housing 40, thereby reducing the size of the housing 40.

Moreover, as shown in FIG. 6, the sensor board 30 is mounted on the face of the partition portion 44 at the second room 42 side and is stabilized by attaching the sensor board 30 to the partition portion 44, it is possible to suppress any deflection of the sensor board 30 and to improve the detection accuracies of the angular velocity sensor 33 and the acceleration sensor 34.

As shown in FIG. 2, as the shielding member 72 for accommodating the angular velocity sensor 33 and the acceleration sensor 34 is electrically connected to the motor 200, even if electrical noises are generated from the electromagnetic valve V and the motor 200, such electrical noises are allowed to flow to the motor 200 via the conductive shielding member 72 and the terminal T. That is, as the shielding member 72 which separates the sensor accommodating portion 70 and the first room 41 from each other is grounded, it is possible to cut off the electrical noises. Accordingly, it becomes unnecessary to attach, for example, a capacitor for reducing electrical noises to the sensor board 30 or the control board 20, thereby reducing the number of parts of the electronic control unit 10 and the production cost thereof.

As heats generated from the electromagnetic valve V and the motor 200 are shielded by the shielding member 72, it is possible to prevent such heats from affecting on the angular velocity sensor 33 and the acceleration sensor 34, thereby improving the detection accuracies of the angular velocity sensor 33 and the acceleration sensor 34.

Since the sensor board 30 and the control board 20 are separate parts, when the angular velocity sensor 33 and the acceleration sensor 34 are inspected or adjusted, only the sensor board 30 becomes the inspection/adjustment target, so that the efficiency of the inspection and the adjustment can be improved.

When the specifications of the angular velocity sensor 33 and the acceleration sensor 34 are changed, only parts of the sensor board 30 should be changed, and it is unnecessary to change parts of the control board 20, so that it is possible to reduce the cost and the work time inherent to the change of the specifications of the angular velocity sensor 33 and the acceleration sensor 34.

As shown in FIG. 6, as the reference pins 46 formed on the partition portion 44 of the housing 40 are inserted (engaged) into respective positioning holes 35, 35 (see FIG. 5B) of the sensor board 30, the sensor board 30 can be positioned relative to the partition portion 44 of the housing 40. Accordingly, as the detection axes of the angular velocity sensor 33 and the acceleration sensor 34 can easily match the reference axis set in the front-back and right-left directions of the vehicle, the efficiency for assembling the sensor board 30 and the control board 20 can be improved.

According to the vehicle behavior control device U shown in FIG. 1 and having the electronic control unit 10, the housing 40 can be miniaturized and the whole electronic control unit 10 can be made compact, resulting in miniaturization of the vehicle behavior control device U itself.

Moreover, since the angular velocity sensor 33 and the acceleration sensor 34 (see FIG. 2 for both sensors) are built in the electronic control unit 10, when the vehicle behavior control device U is attached to the vehicle, the vehicle behavior control device U can be easily attached regardless of the position of a harness.

MODIFIED EXAMPLE

The explanation has been given of the first embodiment of the present invention, but the present invention is not limited to the foregoing first embodiment, and can be changed and modified in various forms without departing from the scope of the present invention.

For example, in the first embodiment, as shown in FIG. 2, the shielding member 72 is attached in the opening 71 formed in the partition portion 44 of the housing 40 to form the sensor accommodating portion 70, but without attaching the shielding member 72 in the opening 71 formed in the partition portion 44, the partition between the sensor accommodating portion 70 and the first room 41 may be omitted, and the angular velocity sensor 33 and the acceleration sensor 34 may be disposed so as to protrude into the first room 41 from the opening 71.

Moreover, in the first embodiment, the shielding member 72 shown in FIG. 5A is formed of a conductive metal, but the material of the shielding member 72 is not limited to any particular one if the material is conductive, and for example, a conductive synthesis resin can be used. The shielding member 72 is a casing formed in a box shape, but the shape thereof is not limited to any particular one, and for example, a tabular shielding member may be used to separate the sensor accommodating portion 70 and the first room 41 from each other.

<Second Embodiment>

Figure 8:
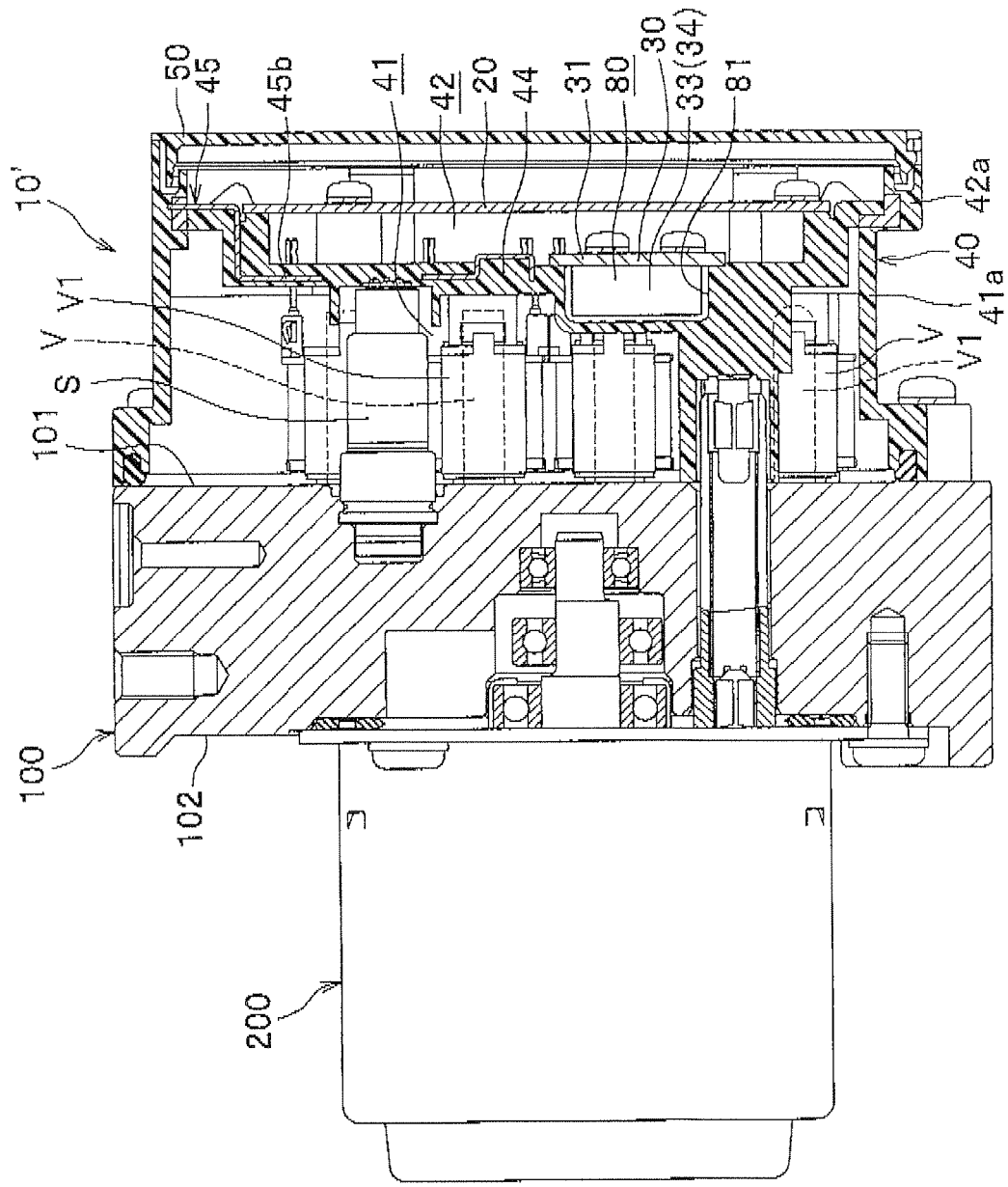
FIG. 8 is a side cross-sectional view showing a vehicle behavior control device having an electronic control unit according to a second embodiment of the present invention.

An electronic control unit 10 of the second embodiment basically has the same structure as that of the electronic control unit 10 of the first embodiment (see FIG. 2), but the difference is that as shown in FIG. 8, a portion which separates the first room 41 and a sensor accommodating portion 80 from each other is integrally formed with the partition portion 44 in the housing 40.

The partition portion 44 of the second embodiment is provided with a recess 81 which is formed in a rectangular shape as viewed from a plane and opened to the second room 42. The sensor accommodating portion 80 of the second embodiment is formed using the recess 81.

An opening of the sensor accommodating portion 80 is blocked off by the sensor board 30, and the angular velocity sensor 33 and the acceleration sensor 34 both attached to the sensor board 30 are accommodated in the sensor accommodating portion 80.

According to the electronic control unit 10' of the second embodiment, the sensor accommodating portion 80 which accommodates the angular velocity sensor 33 and the acceleration sensor 34 therein is formed so as to protrude into the first room 41 using the recess 81 formed in the partition portion 44. That is according to this structure, it is unnecessary to cause a portion for accommodating the angular velocity sensor 33 and the acceleration sensor 34 to protrude from the external face of the housing 40 by efficiently using a space of the first room 41. Accordingly, the housing 40 can be miniaturized, thereby making the whole electronic control unit 10' compact.

Moreover, as a portion which separates the first room 41 and the sensor accommodating portion 80 from each other is integrally formed with the partition portion 44, it is unnecessary to provide a separate part for forming the sensor accommodating portion 80 at the partition portion 44. Therefore, according to such a structure, it is possible to reduce the number of parts of the electronic control unit 10'.

What is claimed is:

1. A vehicle behavior control device comprising a base body having a brake fluid path formed therein, and an electronic control unit, the electric control unit comprising:
   a sensor board to which a sensor for detecting a predetermined physical quantity is attached, wherein the sensor comprises an angular velocity sensor and an acceleration sensor;
   a control board which controls a brake fluid pressure in the brake fluid path by controlling an operation of an electric part based on a behavior of a vehicle body detected by the sensor; and
   a housing which accommodates the sensor board and the control board,
   wherein the housing has a first room for accommodating the electric part, a second room for accommodating the sensor board and the control board in a stacked condition, and a partition portion for separating the first room and the second room from each other,
   wherein a recess which is opened to the second room is formed in the partition portion, and a sensor accommodating portion for accommodating the sensor is formed using the recess,
   wherein the sensor accommodating portion is enclosed by the sensor board directly contacting the partition portion, and
   wherein the control board directly contacts the partition portion.

2. A vehicle behavior control device comprising a base body having a brake fluid path formed therein, and an electronic control unit the electric control unit comprising:
   a sensor board to which a sensor for detecting a predetermined physical quantity is attached, wherein the sensor comprises an angular velocity sensor and an acceleration sensor;
   a control board which controls a brake fluid pressure in the brake fluid path by controlling an operation of an electric part based on a behavior of a vehicle body detected by the sensor; and
   a housing which accommodates the sensor board and the control board,
   wherein the housing has a first room for accommodating the electric part, a second room for accommodating the sensor board and the control board in a stacked condition, and a partition portion for separating the first room and the second room from each other,
   wherein a recess which is opened to the second room is formed in the partition portion, and a sensor accommodating portion for accommodating the sensor is formed using the recess,
   wherein the sensor accommodating portion is enclosed by the sensor board directly contacting the partition portion,
   wherein the control board directly contacts the partition portion, and
   wherein the sensor board is mounted on a face of the partition portion at the second room side.

3. A vehicle behavior control device comprising a base body having a brake fluid path formed therein and an electronic control unit, the electronic control unit comprising:
   a sensor board to which a sensor for detecting a predetermined physical quantity is attached, the sensor comprising an angular velocity sensor and an acceleration sensor;
   a control board which controls an operation of an electric part based on the physical quantity detected by the sensor; and
   a housing which accommodates the sensor board and the control board, the housing having a first room for accommodating the electric part, a second room for accommodating the sensor board and the control board in a stacked condition, and a partition portion for separating the first room and the second room from each other, wherein a recess which is opened to the second room is formed in the partition portion and a sensor accommodating portion for accommodating the sensor is formed using the recess,
   wherein the control board controls a brake fluid pressure in the brake fluid path by controlling an operation of the electric part based on a behavior of a vehicle body detected by the sensor,
   wherein the sensor accommodating portion is enclosed by the sensor board directly contacting the partition portion.

* * * * *